US 6,724,479 B2

(12) United States Patent
Zaidi

(10) Patent No.: US 6,724,479 B2
(45) Date of Patent: Apr. 20, 2004

(54) METHOD FOR OVERLAY METROLOGY OF LOW CONTRAST FEATURES

(75) Inventor: Shoaib Hasan Zaidi, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 123 days.

(21) Appl. No.: 09/967,176

(22) Filed: Sep. 28, 2001

(65) Prior Publication Data

US 2003/0063278 A1 Apr. 3, 2003

(51) Int. Cl.$^7$ .............................................. G01B 11/00
(52) U.S. Cl. ..................................................... 356/401
(58) Field of Search ................................ 356/399, 401, 356/614, 512; 250/559.3, 559.44, 559.39, 201.7, 202; 430/22.3; 382/151; 438/401; 355/53, 55

(56) References Cited

U.S. PATENT DOCUMENTS

| | | | | |
|---|---|---|---|---|
| 4,545,684 A | * | 10/1985 | Kuroki et al. ............... | 356/400 |
| 5,114,235 A | * | 5/1992 | Suda et al. .................. | 356/401 |
| 5,369,488 A | * | 11/1994 | Morokuma .................. | 356/493 |
| 5,481,363 A | * | 1/1996 | Matsugu et al. ............. | 356/401 |
| 5,843,831 A | * | 12/1998 | Chung et al. ............... | 438/401 |
| 6,091,846 A | * | 7/2000 | Lin et al. .................... | 382/145 |
| 6,130,419 A |   | 10/2000 | Neal | |
| 6,141,107 A | * | 10/2000 | Nishi et al. ................. | 356/401 |
| 6,184,974 B1 |  | 2/2001 | Neal et al. | |
| 6,199,986 B1 |  | 3/2001 | Williams et al. | |
| 6,266,130 B1 | * | 7/2001 | Hasegawa et al. ............ | 355/53 |
| 6,269,322 B1 | * | 7/2001 | Templeton et al. ......... | 702/150 |
| 6,356,345 B1 | * | 3/2002 | McArthur et al. .......... | 356/121 |
| 6,462,818 B1 | * | 10/2002 | Bareket ....................... | 356/401 |

* cited by examiner

Primary Examiner—Zandra V. Smith
Assistant Examiner—Gordon J. Stock, Jr.
(74) Attorney, Agent, or Firm—Slater & Matsil, L.L.P.

(57) ABSTRACT

A wavefront sensing tool, such as a Shack-Hartmann detector, detects alignment features in a semiconductor wafer that might otherwise be undetectable using conventional optical tools, such as a microscope. This is particularly advantageous for alignment features formed in photoresist with a height that is less than one fourth the illuminating light's wavelength. The wavefront sensing tool can be used in conjunction with conventional optical tools and a composite alignment image can be formed from the two tools. For higher sensitivity, the light reflected off the wafer can be magnified, with e.g. a telescopic lens, prior to impinging upon the wavefront sensing tool. The composite image can be generated by one or both of the tools or by a computer coupled to the tools.

22 Claims, 3 Drawing Sheets

METHOD FOR OVERLAY METROLOGY OF LOW CONTRAST FEATURES

TECHNICAL FIELD OF THE INVENTION

The present invention relates generally to semiconductor fabrication and, more particularly to a method for measuring alignment marks in semiconductor fabrication.

BACKGROUND OF THE INVENTION

The use of alignment marks to measure and control the overlay accuracy of various layers in semiconductor processing is well known. Traditionally, optical detection and measurement of the alignment marks has been employed. A top layer is aligned to underlying layers by detecting the overlay variation between an alignment feature that has previously been formed on the underlying layer(s) and an alignment feature that is formed in a photoresist layer on the top layer. Oftentimes a box in a box pattern is employed, such as illustrated in FIG. 1a, with one box having been formed in the underlying layer and the other box having been formed in the resist layer.

As device geometries and features sizes decrease, alignment of the layers becomes increasingly critical and tolerances become increasingly tighter. Unfortunately, as device geometries and feature sizes decrease, detection and measurement of the alignment marks becomes more difficult. One reason for this difficulty is that resist lines are transparent and have very small vertical dimensions. Generally, if the height of features defined by the resist Ones is more than one fourth of the illuminating light wavelength ($\lambda/4$) of the conventional optical methods, the features are easily visible due to destructive interference of the light between the top and bottom surface of the features. As device geometries shrink, and the height of the alignment features decreases below $\lambda/4$, visibility of the features diminishes due to loss of contrast Thus, the alignment features cannot be effectively utilized. Furthermore, the resist features; which are typically transparent at the illuminating light source wavelengths, are particularly difficult to see on polished silicon wafers.

What is needed then is a method and apparatus for detecting and measuring alignment features that have a height less than one fourth the illuminating light source wavelength and that can be easily integrated as an adjunct method and apparatus used with conventional alignment techniques. The method must also allow visibility of resist lines on polished (i.e. highly reflective) surfaces, such as a silicon wafer or metal layers including but not limited to aluminum, copper, or tungsten.

SUMMARY OF THE INVENTION

These and other problems are generally solved or circumvented, and technical advantages are generally achieved, by the present invention that provides for a structure having a method for overlay metrology of low contrast alignment features.

In a first aspect, the present invention provides for a method of detecting the alignment of two layers in an integrated circuit comprised of multiple stacked layers of material, one underlying layer having a first alignment mark and one overlying layer having a second alignment mark. The method comprises detecting the first alignment mark and a reference alignment mark using a first alignment tool and forming thereof a first image and detecting the second alignment mark and the reference alignment mark using a second alignment tool and forming thereof a second image. The method further comprises forming a composite image from the first and second image by aligning the reference mark in the first and second image.

In another aspect, the invention provides for an alignment detection apparatus comprising a stage having a surface for receiving thereon a semiconductor wafer, a light source directed to illuminate a wafer when placed upon said stage, and a beam splitter located to intercept light from said light source reflected off a wafer placed upon said stage and to split said reflected light into a first light path and a second light path. The apparatus further includes an optical tool in the first light path and a wavefront sensing tool in the second light path. The apparatus further comprises a computer coupled to the optical tool and the wavefront sensing tool and receiving there from alignment detection data and outputting an alignment image.

In yet another aspect, the invention provides for a method for measuring the overlay alignment of at least two layers of a semiconductor device using a wavefront sensing tool. The method includes generating a reference signal by observing a flat reference surface with the wavefront sensing tool and storing the resulting signal, aligning at least a portion of the semiconductor wafer containing a first and second alignment mark with the wavefront sensing tool, and illuminating the portion of the wafer and detecting a wavefront of light reflected from the portion of the wafer and from the first and second alignment marks. The method further includes magnifying the reflected wavefront of light, generating a wavefront slope signal by observing the magnified reflected wavefront of light with the wavefront sensing tool, determining the location of the first and second alignment marks by comparing the wavefront slope signal with the reference signal, and calculating a distance between the first and second alignment marks based upon the results of the step of determining the location of the first and second alignment marks.

An advantage of the preferred embodiment of the present invention is that is can be used as an adjunct method to existing metrology techniques.

Another advantage of the preferred embodiment of the present invention is that the measurement data can be easily combined with the data of other metrology techniques.

Yet another advantage of a preferred embodiment of the present invention is that it can be easily interfaced with a computer system for viewing and analysis.

The foregoing has outlined rather broadly the features and technical advantages of the present invention in order that the detailed description of the invention that follows may be better understood. Additional features and advantages of the invention wilt be described hereinafter, which form the subject of the claims of the invention. It should be appreciated by those skilled in the art that the concepts and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments, and are not necessarily drawn to scale.

DETAILED DESCRIPTION OF PREFERRED EMBODIMENTS

The making and use of the presently preferred embodiment is discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1A:
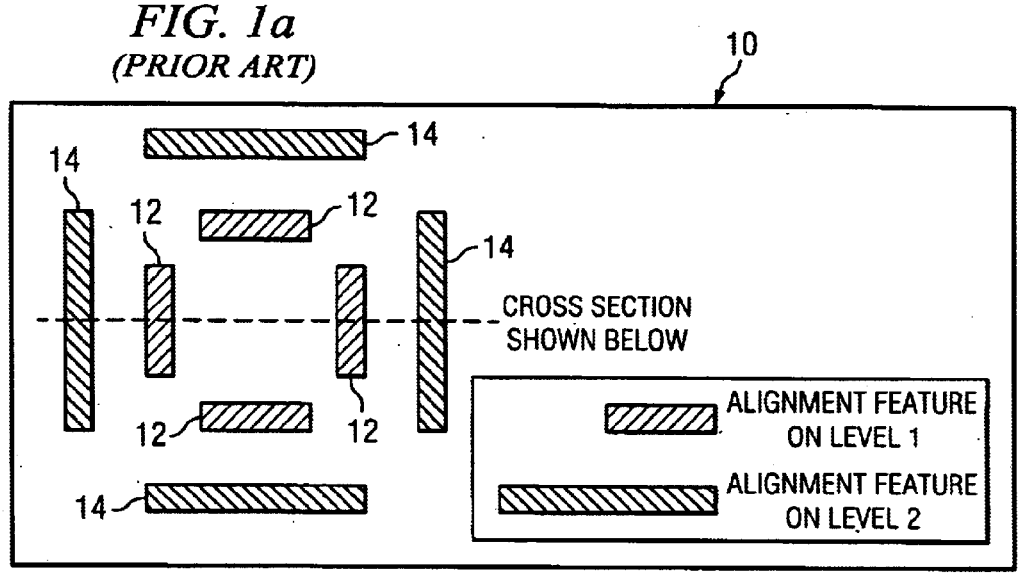
FIG. 1a is a plan view of an alignment mark.

FIG. 1A illustrates a top view of exemplary alignment features at different levels (layers) of a semiconductor device. The alignment mark 10 includes a first alignment feature 12 and a second alignment feature 14. The alignment features 14 are produced by conventional methods of photolithography and are formed of material in an underlying layer, such as silicon, polysilicon, oxide, nitride, metal layer, or other known semiconductor layer. Alignment marks 12 are formed in a top layer of photoresist material. For illustrative purposes, the alignment mark 10 is shown as a conventional box-in-box or frame-in-frame configuration. Detection and measurement of other alignment geometries is within the scope of the present invention as well.

Figure 1B:
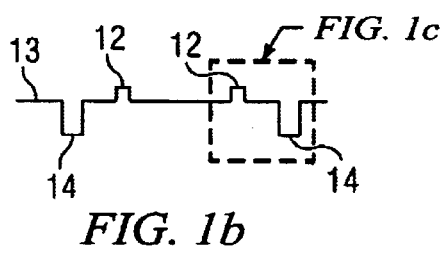
FIG. 1b is a cross section of an idealized alignment mark.
Figure 1C:
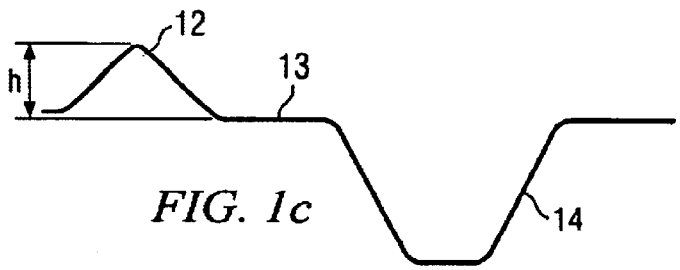
FIG. 1c is a cross section of a portion of an alignment mark showing non-ideal features.

FIG. 1B is a cross section of an idealized alignment mark 10. As shown, alignment features 14 are formed on an underlying layer (below the top surface 13 of the device being measured) and alignment features 12 are formed on a top layer, i.e. on top of surface 13. By detecting and measuring the overlay between alignment features 12 and 14, the overall pattern alignment between the differing layers can be monitored and controlled. FIG. 1C illustrates in cross section, the non-idealized aspects of alignment marks 12 and 14 for a portion of the cross section illustrated in FIG. 1B. Note that typically, the features are somewhat indistinct with non-vertical edges and rounded features. The height h of alignment feature 12 is illustrated in FIG. 1C and is the height of the top of the feature 12 above the top surface 13 of the wafer or device being measured. The alignment features can be difficult to see using conventional optical techniques, particularly if the vertical height or vertical depth of the alignment features 12, 14 are small relative to the light source. The problem is particularly pronounced when the feature height or depth falls in a range of less than about one fourth of the wavelength of the illuminating light source.

Figure 2:
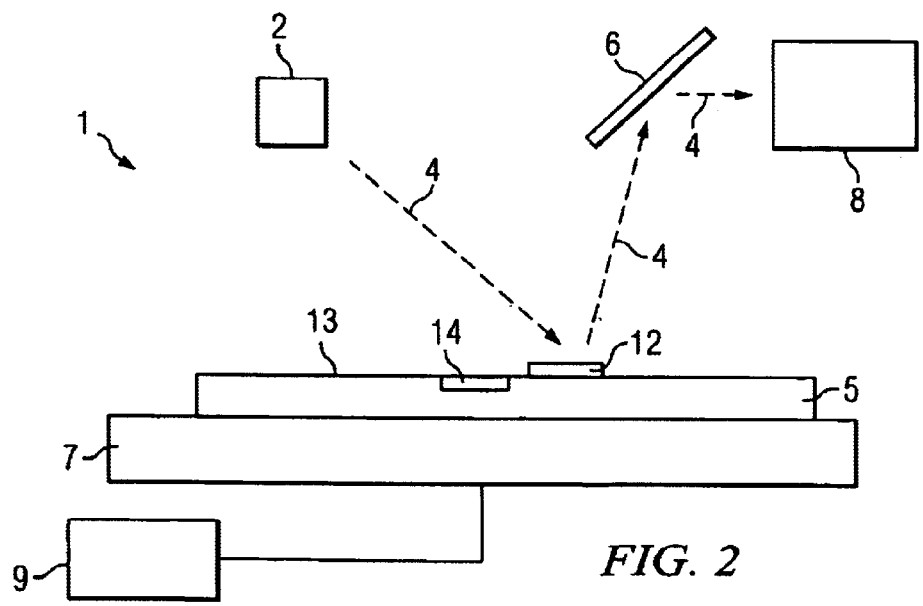
FIG. 2 schematically illustrates a preferred embodiment system employing features of the present invention.

FIG. 2 illustrates a first preferred embodiment system 1 for detecting and measuring alignment marks 12, 14 located on a wafer 5. The system includes an illumination source 2 that illuminates wafer 5 (or portions thereof, including the portions containing alignment features 12, 14) with a light beam 4. The wafer 5 is preferably mounted on a stage 7 that allows for relative movement between the wafer 5 and a wavefront sensing tool 8 in order to scan across the wafer surface. The stage 7 operates under the control of motors and control logic 9. In other embodiments, wafer 5 may be held stationary and wavefront sensing tool 8 is operated to move relative to the wafer in order to perform the scan. In still other embodiments, light from illumination source 2 can be directed through the use of alignment mirrors and focusing optics to scan across different regions of a stationary wafer. Illumination source 2 can be any appropriate light source of strength. Typical illumination sources currently used in semiconductor manufacturing include a number of incoherent (incandescent and discharge lamps) and coherent (lasers) sources in the 157 nm to 800 nm wavelength range—although the scope of this invention is not limited to any particular type of illumination source. The light beam reflects off of the surface 13 of the wafer and alignment features 12, 14 and impinges upon alignment mirror 6, where the light beam is aligned to the input of wavefront sensing tool 8. One skilled in the art win recognize that various optical components of the system 1, such as focusing lenses, additional alignment mirrors, light shields, and the like, are part of the preferred embodiments, but are not included for clarity of the drawings because they are not necessary to an understanding of the present invention. Likewise, other features that may be included in the preferred embodiment system but not necessary to understanding the invention—such as a wafer mounting assembly—are omitted from the drawings for clarity, although one skilled in the art will readily recognize their applicability. As will be described in greater detail below, wavefront sensing tool 8 receives the light beam that has been reflected off of, and hence distorted by, surface 13 and alignment features 12 and 14. By detecting the distortion imparted onto the light beam by the features 12 and 14, wavefront sensing tool 8 is able to measure the relative placement (i.e. the displacement of and hence the alignment between) alignment features 12, 14.

Figure 3:
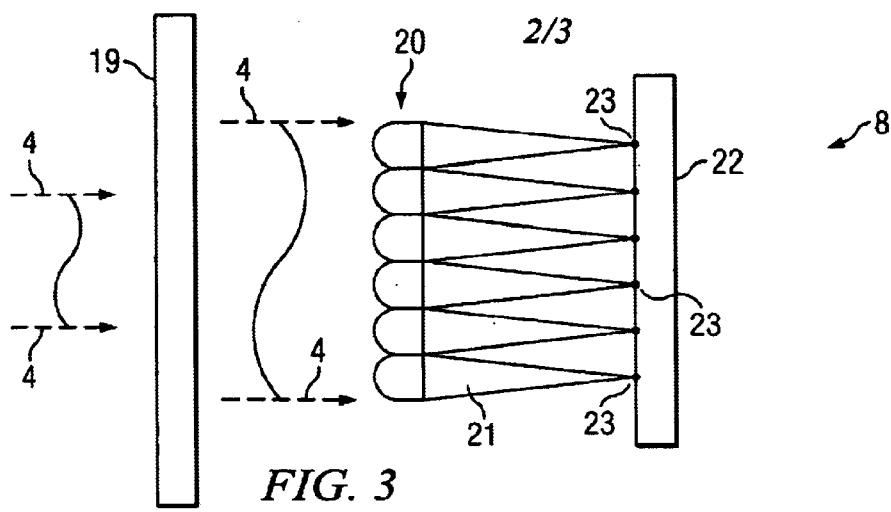
FIG. 3 schematically illustrates a wavefront sensing tool employed in the preferred embodiment system.

FIG. 3 illustrates wavefront sensing tool 8 in greater detail. In the preferred embodiments, wavefront sensing tool 8 comprises a Shack-Hartmann detector. The principles and operation of Shack-Hartmann sensors are well known in the art. Reference is made to U.S. Pat. No. 6,184,974 for additional information relating to the Shack-Hartmann sensor, which patent is incorporated herein by reference. Briefly, incoming light beam 4 impinges upon the wavefront sensing tool 8 after reflecting off of the surface and surface features (including alignment features 12, 14) to be measured. In the preferred embodiments, the light beam 4 passes through optics, such as telescopic lens 19. Light beam 4 is magnified by lens 19 as is shown schematically in the figure. Lens 19 provides greater resolution and sensitivity of the tool 8.

The magnified light beam 4 passes through lens 19 and impinges upon lenslet array 20. Array 20 operates to split light beam 4 into a series of light rays 21 that are spot focused on sensor array 22. In other words, sensor array 22 is in the focal plane of lenslet array 20 and hence the light rays 21 reach sensor array 22 as an array of tightly focused spots of light 23. In the preferred embodiments, sensor array 2 is a charge coupled device (CCD) array, although other altered arrays such as CMOS photosensors, photodiodes, photographic film, and the like could be employed. Likewise, lenslet array 20 could alternatively be replaced with an aperture array or the like. The resolution of a typical lenslet array 20 is about 100 to 200 microns. In other words, the array 20 can only resolve vertical deviations between features that are spaced no less than 100 to 200 microns apart. Lens 19 allows for greater sensitivity by magnifying a portion of the surface being analyzed—thus the lenslet array 20 is provided a magnified image upon which to resolve.

In operation, a reference surface such as a (near) perfectly flat surface is scanned by wavefront sensing tool 8 and the location of the spots 23 measured. This provides a reference measurement. Next, the surface to be measured for alignment is scanned and the location of the spots 23 once again measured By detesting the deviations in the spot locations, the distortion of the wavefront for light beam 4 can be detected. Because this distortion is a direct result of deviations in the surface, the surface features can be readily detected and their size and relative location can be measured.

Figure 4A:
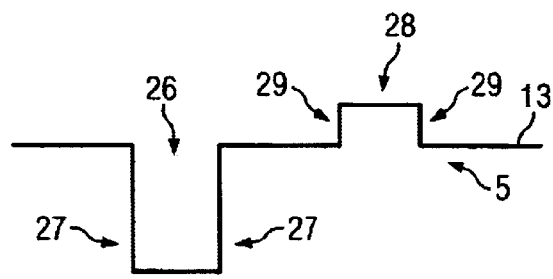
FIGS. 4a and 4b illustrate piston deviations and the wavefront distortion caused by them, respectively.
Figure 4B:
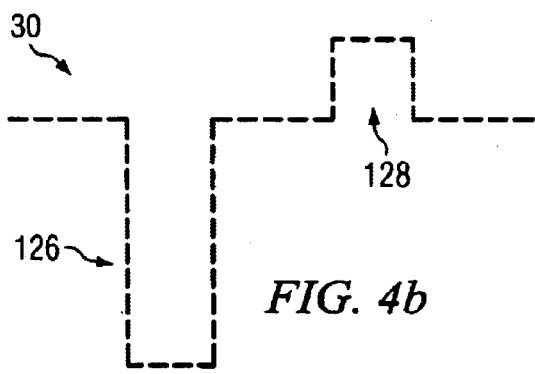
Figure 5A:
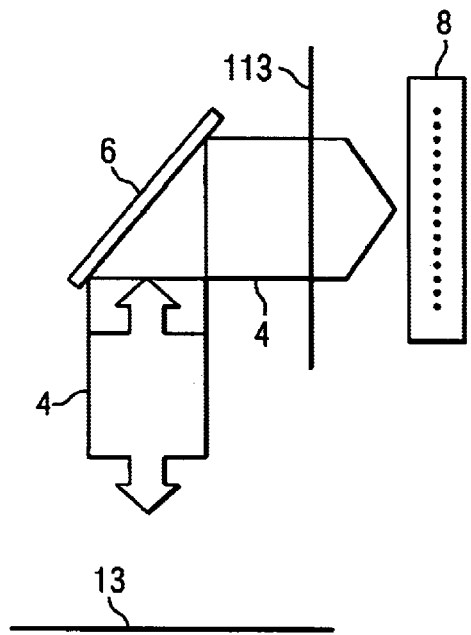
FIGS. 5a and 5b schematically illustrate detection of a reference surface and of an alignment mark, respectively.
Figure 5B:
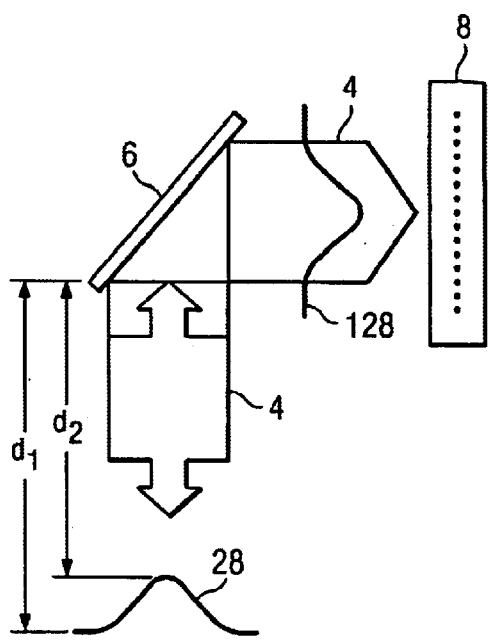

Note that wavefront sensing tools operate by detecting the slope in the distortion to the light beam wavefront. Surface features that have a very steep or no slope, such as perfectly vertical sidewalls, cannot be detected using conventional wavefront sensing tools. FIG. 4a illustrates two such features 26 and 28, commonly referred to as piston deviations. Piston deviation feature 26 is a depression within surface 13 of exemplary wafer 5 and piston deviation feature 28 is raised above the surface 13. Note that sidewalls 27 of feature 26 arc essentially vertical and the sidewalls 29 of feature 28 are likewise essentially vertical. FIG. 4b schematically illustrates the distortion that would be imparted onto a light beam wavefront 30 after reflecting off the surface 13 and features 26, 28 of FIG. 4a. FIG. 4b illustrates two phenomena that are relevant to understanding the invention. First, note that the wavefront distortion 30 has a feature 126 corresponding to the surface feature 26 and a feature 128 corresponding to the surface feature 28. These features (which are simply distortions in the wavefront of light beam 4) have essentially zero slope at their edges. As discussed above, because wavefront sensing tools detect variations in the slope of the incoming light beam wavefront, such features would be very difficult if not impossible to detect, The second phenomenon illustrated by wavefront 30 is that feature 126 has twice the amplitude of the actual surface feature 26 that was detected and feature 128 has twice the amplitude of the actual surface feature 28 that was detected. This phenomenon is explained with reference to FIGS. 5a and 5b. FIG. 5a schematically illustrates a light beam 4 impinging upon a flat surface 13 and being reflected from the surface 13 to alignment mirror 6, where the beam is reflected to impinge upon wavefront sensing tool 8. Note that the wavefront is schematically illustrated as having no distortion arising from flat surface 13 (as illustrated by curve 113). By contrast, FIG. 5b illustrates that the wavefront is distorted by surface feature 28, as indicated by the wavefront 128 schematically illustrated in the light beam 4 of FIG. 5b. Note, as in FIG. 4b, this curve is shown with twice the amplitude as the actual feature 28. This is because the light beam 4 impinging upon the flat surface 13 of the wafer travels a distance of $d_1$ between the flat surface and the plane of the alignment mirror 6, whereas the light beam impinging upon the top of feature 28 travels only a (lesser) distance of $d_2$ between the top of the feature and the plane of the mirror. In fact, the impact of the difference between the top of the feature and the flat surface is doubled. This is because the light beam first travels from the light source 2 to the wafer 5 (and hence the first distance $d_1$ minus $d_2$ is imposed) and then the light beam reflects from the wafer to the alignment mirror (and hence the second distance $d_1$ minus $d_2$ is imposed). This phenomenon can be advantageously exploited because it increases the sensitivity of the wavefront sensing tool 8 (i.e. the distortions caused by a surface feature are doubled and hence easier to detect).

Figure 4C:
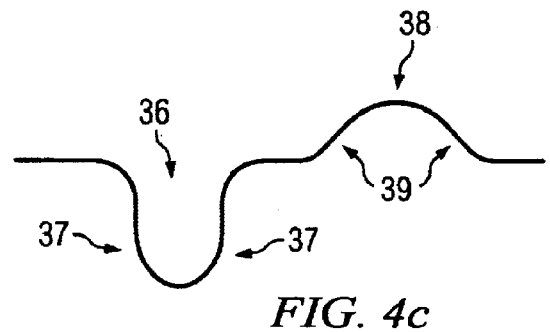
FIGS. 4c and 4d illustrate preferred alignment features and the wavefront distortion caused by them, respectively.
Figure 4D:
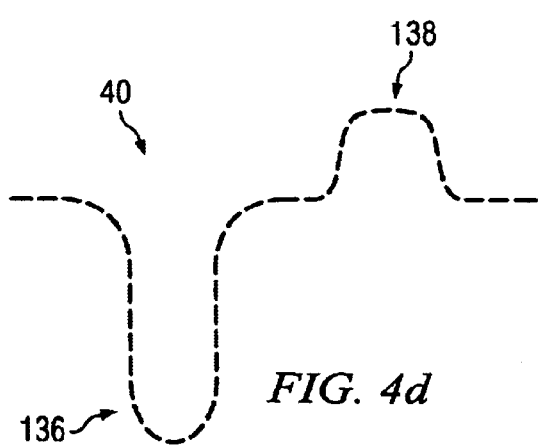

Returning now to FIG. 4c, preferred features 36 and 38 are shown; note that these feature have rounded sidewalls 37 and 39, respectively. As illustrates in FIG. 4d, such features impart distortion 136, 138 onto the wavefront 40 of the light beam that has sloping features. Because the wavefront distortion has a slope, wavefront sensing tool 8 can easily detect the features 36, 38. Note also that, as above, the amplitude of the distortion features 136, 138 is twice that of the measured surface features 36, 38, respectively. By scanning the wafer relative the wavefront sensing tool, the location of surface features 36, 38, and the like, can be detected and the alignment between them can be readily determined.

Figure 6:
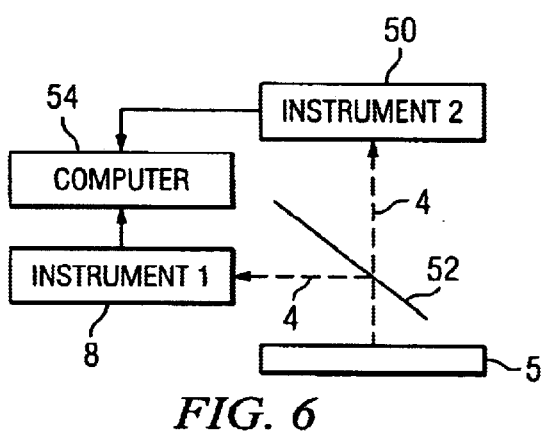
FIG. 6 illustrates another preferred embodiment system employing features of the present invention.

FIG. 6 illustrates another preferred embodiment system for detecting alignment between alignment features located on different layers of a semiconductor device. FIG. 6 will be described with reference to the alignment features 12, 14 illustrated in FIG. 1a. In this embodiment it is assumed, however, that one of the alignment features—say features 14—can be detected using conventional optical alignment tools such as a high powered microscope. In FIG. 6, such a conventional optical alignment feature detection system is schematically illustrated as 50. Also shown in FIG. 6 is a wavefront sensing tool 8, such as described above. Tool 8 is employed to detect other features, such as features 12, that cannot be detected using conventional optical tool 50. Examples of such tools could include atomic force microscopes (AFMs) and scanning electron microscopes (SEMs). Light beam 4 is shown as reflecting off of wafer 5 (including top surface 13 and features 12, 14, although not shown in FIG. 6 for clarity) as in the above-described embodiments. In this preferred embodiment, however, light beam 4 is split by beam splitter 52, with a portion of light beam 4 being deflected to wavefront sensing tool 8 and a portion of light beam 4 passing on to optical tool 50. Beam splitter 52 can be any well-known beam splitter device.

Wavefront sensing tool 8 will receive the incoming light beam 4, including the wavefront distortions discussed above and will compare the received array of light spots 23 to an array for a reference surface, all as described in greater detail above. In some embodiments, wavefront sensing tool 8 will convert the detected variations in the light spots into an electrical signal or even into an image signal, which signal is the passed to computer 54. In other embodiments, wavefront sensing tool 8 merely detects the deviations in the light spots 23 and passes that information to computer 54, where the information is converted into image data.

Figure 7:
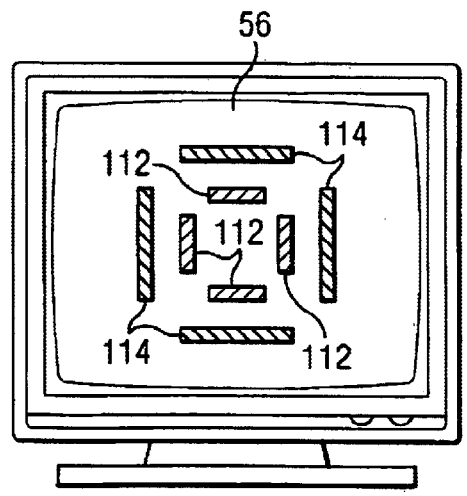
FIG. 7 illustrates an exemplary display showing a composite image from two alignment feature sensing tools.

Optical tool 50 also receives light beam 4. Tool 50 typically includes a photosensor array wherein the incoming light is detected and converted into an electrical signal. Typically, the electrical signal is converted into an image by optical tool 50, which image is then passed to computer 54. In some embodiments, optical tool 50 merely passes the electrical signal to computer 54 and the conversion into an image occurs in the computer. Computer 54 takes the image information from wavefront sensing tool 8 and from optical tool 50 and overlays the two images. In other embodiments, computer 54 may be integrated into the optical tool 50 or wavefront sensing tool 8. Because both tools 8 and 50 operated upon the same incoming light beam, the two images will be aligned. By overlaying the two images—with the image from wavefront sensing tool showing the location of alignment features 12 and the image from optical tool 50 showing the location of alignment features 14—the overlay alignment between the features, including the distance between the features, can be detected and measured. FIG. 7 shows an exemplary composite image 56 showing features 112 that were detected by wavefront sensing tool 8 overlaid with features 114 that were detected by optical tool 50.

In the above-described embodiment, wavefront sensing tool 8 and optical tool 50 detect the alignment features simultaneously, using the same light beam as split by beam splitter 52. Beam splitter 52 can be removed, however, in other embodiments, provided that some way of aligning the image data from the two tools is available. For instance, both optical tool 50 and wavefront sensing tool 8 might be able to detect some other feature located on wafer 13. Upon receiving image data from optical tool 50 and from wavefront sensing tool 8, computer 54 could align the images by aligning the feature that is common to both images. The common feature is referred to herein as a reference alignment mark. This type of image detection and alignment is well known in the art. One example of such a feature might be alignment features 14. These features are typically optically detectable by optical tool 50 and, because the features 14 typically also create a depression in the top surface of the wafer (see FIG. 1a), they are detectable by wavefront sensing tool 8. As such, computer 52 could align image data from optical tool 50 and wavefront sensing tool 8 by aligning features 14 common to both images. In yet other embodiments, some other surface feature tool, such as an atomic force microscope, could be substituted in place of optical tool 50. Furthermore, the above teachings could be applied to yet a third alignment mark, which third alignment mark could be detected with the optical tool and an image thereof formed. In one embodiment, the third alignment mark could be formed in a layer underlying the first and second layers in which the first and second alignment marks are formed, respectively, and a composite image of the first, second, and third alignment marks could be formed, as described above.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, manufacture, composition of matter, means, methods and steps described in the specification. As one of ordinary skill in the art will readily appreciate from the disclosure of the present invention, processes, manufacture, compositions of matter, means, methods, or steps, presently existing or later to be developed, that perform substantially the same function or achieve substantially the same result as the corresponding embodiments described herein may be utilized according to the present invention. As just one example, the advantageous features of the present invention could be obtained in some embodiments through the use of an atomic force microscope as one of the alignment detection tolls. Accordingly, the appended claims are intended to include within their scope such processes, manufacture, compositions of matter, means, methods, or steps.

What is claimed is:

1. A method of detecting the alignment of two layers in an integrated circuit comprising multiple stacked layers of material, one underlying layer having a first alignment mark and one overlying layer having a second alignment mark, the method comprising:
    detecting the first alignment mark and a reference mark using a wavefront sensing tool and forming thereof a first image;
    detecting the second alignment mark and the reference mark using a second alignment tool and forming thereof a second image; and
    forming a composite image from the first and second image by aligning the reference mark in the first and second image.

2. The method of claim 1 further comprising scanning the integrated circuit relative to the first and second alignment tools.

3. The method of claim 1 wherein the step of detecting the second alignment mark comprises observing the integrated circuit with a microscope.

4. The method of claim 1 wherein the reference mark comprises the first alignment mark.

5. The method of claim 1 wherein the step of detecting the first alignment mark further comprises illuminating the integrated circuit with a light source and magnifying light reflected from the integrated circuit.

6. An alignment detection apparatus comprising:
    a stage having a surface for receiving thereon a semiconductor wafer;
    a light source directed to illuminate a wafer when placed upon said stage with a light having a predetermined wavelength;
    a beam splitter located to intercept light from said light source reflected off a wafer placed upon said stage and to split said reflected light into a first light path and a second light path;
    an optical tool in the first light path, configured to detect an alignment mark in a layer on the semiconductor wafer;
    a wavefront sensing tool in the second light path; and
    a computer coupled to the optical tool and the wavefront sensing tool and receiving there from alignment detection data and outputting an alignment image.

7. The alignment detection apparatus of claim 6 further comprising a device for moving a semiconductor wafer placed on the stage in relation to the optical tool and wavefront sensing tool.

8. The alignment detection apparatus of claim 6 wherein the optical tool is a microscope.

9. The alignment detection apparatus of claim 6 wherein the wavefront sensing tool is a Shack-Hartmann detector.

10. The alignment detection apparats of claim 6 wherein the computer is integrated within either the optical tool or the wavefront sensing tool.

11. The alignment detection apparatus of claim 6 wherein the alignment image is an image of alignment features, at least one of which is on the surface of a wafer placed on the stage.

12. The alignment detection apparatus of claim 11 in which the alignment features comprise a feature formed on a layer beneath the surface of the wafer.

13. The alignment detection apparatus of claim 11 in which the alignment features comprise features formed of photoresist on the surface of the wafer.

14. The alignment detection apparatus of claim 13 wherein the alignment features have a height of less than one fourth the wavelength of the light source.

15. A method for measuring the overlay alignment of at least two layers of a semiconductor wafer using a wavefront sensing tool comprising:

generating a reference signal by observing a flat reference surface with the wavefront sensing tool and storing the resulting signal;

aligning at least a portion of the semiconductor wafer containing a first and second alignment mark with the wavefront sensing tool;

illuminating the portion of the wafer and detecting a wavefront of light reflected from the portion of the wafer and from the first and second alignment marks;

magnifying the reflected wavefront of light;

generating a wavefront slope signal by observing the magnified reflected wavefront of light with the wavefront sensing tool;

determining the location of the first and second alignment marks by comparing the wavefront slope signal with the reference signal; and calculating a distance between the first and second alignment marks based upon the results of the step of determining the location of the first and second alignment marks.

16. The method of claim 15 further comprising generating an image of the first and second alignment marks.

17. The method of claim 15 further comprising observing the reflected light with an optical tool and determining the location of a third alignment mark and creating an image of the third alignment mark.

18. The method of claim 17 wherein the third alignment mark is in a layer underlying the first and second alignment marks.

19. The method of claim 17 wherein the wavefront of light has a wavelength and the first and second alignment marks have a height that is less than one fourth of said wavelength.

20. The method of claim 17 further comprising creating a composite image of the image of the first and second alignment marks and the image of the third alignment mark.

21. The method of claim 20 wherein the composite image is created by aligning a common feature detected by both the wavefront sensing tool and the optical tool.

22. A method of detecting the alignment of two layers in an integrated circuit comprising:

detecting a first alignment feature in a first layer of an integrated circuit using a wavefront sensing tool and forming thereof a first image;

detecting a second alignment feature in a second, underlying layer of the integrated circuit using a microscope and forming thereof a second image;

forming a composite image from the first and second image; and measuring from the composite image overlay between the first and second layer.

* * * * *